(12) United States Patent
Bodvarsson

(10) Patent No.: US 11,882,411 B2
(45) Date of Patent: Jan. 23, 2024

(54) ENCAPSULATION OF ELECTRONIC COMPONENTS ON SUBSTRATE FOR HEARING DEVICE

(71) Applicant: GN Hearing A/S, Ballerup (DK)

(72) Inventor: Thorvaldur Oli Bodvarsson, Ballerup (DK)

(73) Assignee: GN HEARING A/S, Ballerup (DK)

( * ) Notice: Subject to any disclaimer, the term of this patent is extended or adjusted under 35 U.S.C. 154(b) by 0 days.

(21) Appl. No.: 17/721,335

(22) Filed: Apr. 14, 2022

(65) Prior Publication Data

US 2022/0240032 A1 Jul. 28, 2022

Related U.S. Application Data

(63) Continuation of application No. PCT/EP2020/084796, filed on Dec. 7, 2020.

(30) Foreign Application Priority Data

Dec. 19, 2019 (EP) .................................... 19218072

(51) Int. Cl.
  *H04R 25/00* (2006.01)
  *H05K 3/28* (2006.01)

(52) U.S. Cl.
  CPC ......... *H04R 25/658* (2013.01); *H04R 25/609* (2019.05); *H05K 3/284* (2013.01); *H04R 2225/49* (2013.01)

(58) Field of Classification Search
  CPC ............................. H04R 2225/49; H04R 25/00
  (Continued)

(56) References Cited

U.S. PATENT DOCUMENTS

| 7,003,127 B1 * | 2/2006 | Sjursen .................. H04R 25/65 381/328 |
| 2001/0033478 A1 | 10/2001 | Ortiz et al. |
| 2010/0224401 A1 | 9/2010 | Lin et al. |

FOREIGN PATENT DOCUMENTS

| DE | 29608215 | 8/1996 |
| JP | 2012 190960 | 10/2012 |

OTHER PUBLICATIONS

PCT International Search Report and Written Opinion for International Appn. No. PCT/EP2020/084796 dated Feb. 4, 2021.
(Continued)

*Primary Examiner* — George C Monikang
(74) *Attorney, Agent, or Firm* — Vista IP Law Group, LLP

(57) ABSTRACT

Disclosed is a system, a hearing device and a method for encapsulating one or more electronic components on a substrate. The method comprises providing a dam on the substrate, the dam is provided around the one or more electronic components, the dam comprises a dam material comprising an electrically conducting material. The method comprises providing a liquid fill encapsulation material within the dam on the substrate, the fill encapsulation material encapsulates the one or more electronic components, the fill encapsulation material is configured to solidify, the solidified fill encapsulating material comprises a first surface exposed to surroundings. The method comprises applying a cover material on the first surface of the solidified fill encapsulation material, the cover material comprising an electrically conducting material, whereby the one or more electronic components are encapsulated and electromagnetically shielded.

34 Claims, 8 Drawing Sheets

(58) Field of Classification Search
USPC .................................................. 381/189, 312
See application file for complete search history.

(56) References Cited

OTHER PUBLICATIONS

Extended European Search Report for EP Patent Appln. No 19218072.7 dated Jun. 4, 2020.

* cited by examiner

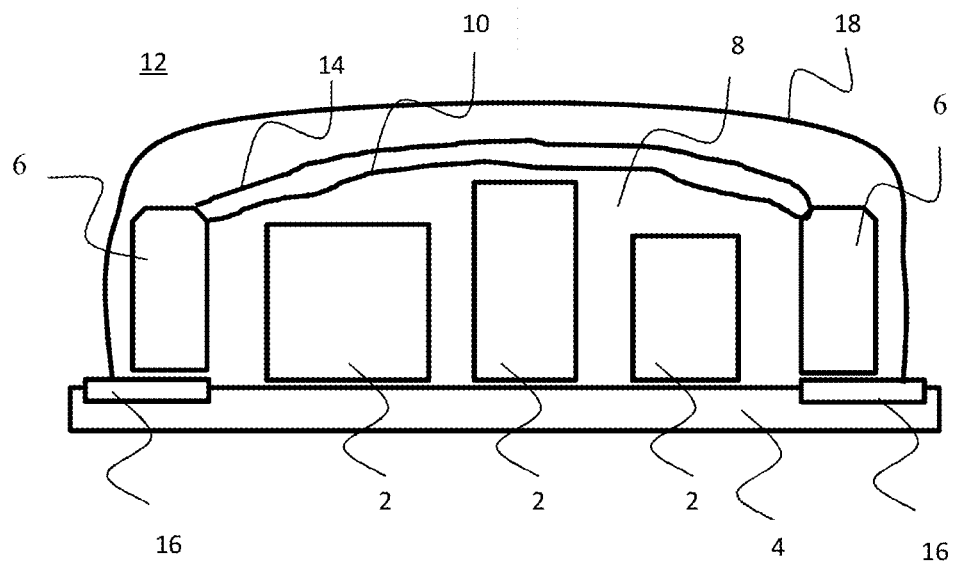
*Fig. 3e)*
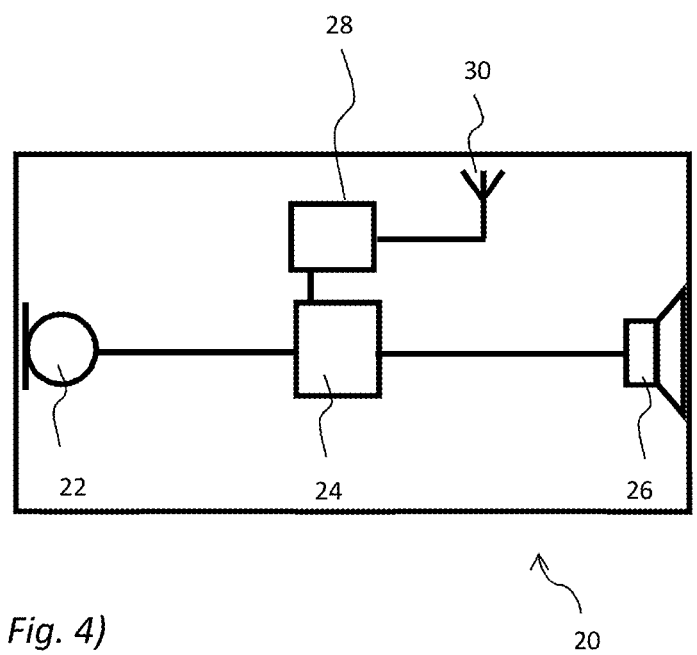
*Fig. 4)*

ENCAPSULATION OF ELECTRONIC COMPONENTS ON SUBSTRATE FOR HEARING DEVICE

RELATED APPLICATION DATA

This application is a continuation of International Patent Application No. PCT/EP2020/084796 filed on Dec. 7, 2020, which claims priority to, and the benefit of, European patent application No. 19218072.7 filed on Dec. 19, 2019. The entire disclosures of the above applications are expressly incorporated by reference herein.

FIELD

The present disclosure relates to a system, a hearing device and a method for encapsulating one or more electronic components on a substrate by providing a dam on the substrate around the one or more electronic components, and by providing a fill encapsulation material within the dam to encapsulate the electronic components.

BACKGROUND

As electronic components on a substrate produces electromagnetic noise, it is an advantage to provide that the electronic components are electromagnetically shielded, such as by encapsulation. There is a need for an improved method for encapsulation of electronic components for providing improved systems and hearing devices with encapsulated electronic components.

SUMMARY

Disclosed is a method for encapsulating one or more electronic components on a substrate. The method comprises providing a dam on the substrate. The dam is provided around the one or more electronic components. The dam comprises a dam material comprising an electrically conducting material. The method comprises providing a liquid fill encapsulation material within the dam on the substrate. The fill encapsulation material encapsulates the one or more electronic components. The fill encapsulation material is configured to solidify. The solidified fill encapsulating material comprises a first surface exposed to surroundings. The method comprises applying a cover material on the first surface of the solidified fill encapsulation material. The cover material comprises an electrically conducting material. Thereby the one or more electronic components are encapsulated and electromagnetically shielded.

It is an advantage to encapsulate electronic components on a substrate, such as a printed circuit board (PCB) in a hearing device. Encapsulation may provide an electromagnetic (EM) shield of the electronic components. Such EM shield is an advantage as the electronic components on a substrate may produce a lot of EM noise. In electronic devices, such as hearing devices, there may be magnetic coils or electromagnetic coils for providing wireless communication with other electronic devices and/or for transmission or reception of radio frequency signals. In a hearing device, there may be a magnetic induction (MI) coil and/or there may be a tele coil. These coils should be electromagnetically (EM) shielded from the electronic components. The electromagnetic field of the electronic components may be an electric field or a magnetic field, when in the near field of the emitting waves. If the electromagnetic field is impending, e.g. from other devices, like mobile phones, hearing aid accessories etc., then it may be electromagnetic since it may then be in the far field. In particular, when using rechargeable batteries in an electronic device, the rechargeable battery may have a high voltage, and such high voltage may disturb for example a magnetic induction (MI) coil. High voltage may be converted to a lower voltage by e.g. a converter. The converter may emit electrical and/or magnetic noise, depending on conversion topology.

It is an advantage to encapsulate electronic components, as encapsulation may also provide mechanical protection of for example discrete components, integrated circuit (IC) chips and bonding wires.

It is an advantage to encapsulate electronic components, as encapsulation may also provide that moist around the electronic components can be avoided or reduced.

It is an advantage that the encapsulation protects the electronic components from moisture, dust, dirt and solvents.

It is an advantage of the method that the one or more electronic components are encapsulated and electromagnetically shielded. This is obtained by providing that the dam material comprises an electrically conducting material and by providing that the cover material comprises an electrically conducting material. The electrically conducting material of the dam and of the cover may be the same electrically conducting material. The electrically conducting material may be a metal or a metal alloy such as for example silver (Ag). The electrically conducting material may be a paste containing one or more metals. The dam may be placed on top of the ground ring of the substrate or may be connected to the ground ring. The dam is placed around the electronic components to be encapsulated. The dam may be a closed structure. The dam material and the cover material are both conductive, and as they are in contact, they connect to each other. Thereby the dam, such as the outside surface of the dam, and the cover material provide the electromagnetic shielding of the electronic components. Thus, both the dam and the cover have electromagnetic interference (EMI) properties due to the electrically conducting material.

Electromagnetic interference (EMI), also called radio-frequency interference (RFI) when in the radio frequency spectrum, is a disturbance that affects an electrical circuit by electromagnetic induction, electrostatic coupling, or conduction. The disturbance may degrade the performance of the circuit or even stop it from functioning. EMI can be used intentionally, as in the present method, for providing electromagnetic shielding of the electronic components on the substrate.

When the electronic components are encapsulated on the substrate, the substrate may be mounted in a system or in an electronic device, whereby the electronic components can be performing various functions in the system or in the electronic device.

The electronic device may be a communication device, such as a smart phone, tablet, pc, wearable device etc.

The electronic device may be a hearing device. The hearing device may be a headset or earbud(s) for audio communication. The hearing device may be a hearing protector for protection of e.g. impulse sounds. The hearing device may be a hearing aid for compensating for a hearing loss of the user. The hearing aid may be any hearing aid, such as a hearing aid of the in-the-ear type, such as in-the-canal type, such as completely-in-the-canal type of hearing aid, etc., a hearing aid of the behind-the-ear type, of the receiver-in-the-ear type of hearing aid, etc.

The hearing device may comprise a microphone configured for converting an acoustic sound signal from a sound source into an audio signal. The audio signal is configured to be processed in a processing unit for compensation of the hearing loss of the user. The processed audio signal is configured to be converted into a processed acoustic signal by a receiver.

The hearing device may comprise one or more antennas for radio frequency communication. The one or more antennas may be configured to operate in a first frequency range, such as at a frequency above 800 MHz, such as at a frequency above 1 GHz, such as at a frequency of 2.4 GHz, such as at a frequency between 1.5 GHz and 3 GHz, during use. Thus, the first antenna may be configured for operation in ISM frequency band. The first antenna may be any antenna capable of operating at these frequencies, and the first antenna may be a resonant antenna, such as monopole antenna, such as a dipole antenna, etc. The resonant antenna may have a length of lambda/4 or any multiple thereof, lambda being the wavelength corresponding to the emitted electromagnetic field.

The hearing device may comprise one or more wireless communications unit(s) or radios. The one or more wireless communications unit(s) are configured for wireless data communication, and in this respect interconnected with the one or more antennas for emission and reception of an electromagnetic field. Each of the one or more wireless communication unit may comprise a transmitter, a receiver, a transmitter-receiver pair, such as a transceiver, a radio unit, etc. The one or more wireless communication units may be configured for communication using any protocol as known for a person skilled in the art, including Bluetooth, WLAN standards, manufacture specific protocols, such as tailored proximity antenna protocols, such as proprietary protocols, such as low-power wireless communication protocols, RF communication protocols, magnetic induction protocols, etc. The one or more wireless communication units may be configured for communication using same communication protocols, or same type of communication protocols, or the one or more wireless communication units may be configured for communication using different communication protocols.

The hearing device may be a binaural hearing device. The hearing device may be a first hearing device and/or a second hearing device of a binaural hearing device.

The electronic device or the hearing device may a device configured for communication with one or more other device, such as configured for communication with another hearing device or with an accessory device or with a peripheral device.

The method provides that the electronic components are encapsulated on the substrate. The substrate may be a printed circuit board (PCB) or a separate plate which is attached to the PCB.

The electronic components may be surface mounted components such as transistors, resistors, capacitors, integrated circuits, inductors, diodes etc. The electronic components may be one or more batteries, such as rechargeable batteries.

The method comprises providing a dam on the substrate. The dam may be a barrier or a wall. The height of the dam may be from 1 micrometer (µm) to 5 millimeter (mm), such as 10 µm, such as 0.5 mm, such as 1 mm. The width of the dam may be from 0.5 micrometer (µm) to 5 millimeter (mm), such as 0.5-1 mm. The dam is provided around the one or more electronic components. The dam comprises a dam material comprising an electrically conducting material. The dam may be arranged on a ground ring of the substrate or on a connection to the ground ring of the substrate. The dam may comprise a material being a combination or mix of an epoxy based material and the electrically conducting material, such as silver. The dam material may comprise a material such as Tatsuta AE1244. A solvent may be added to the material. The dam may be provided on the substrate by a dedicated manufacturing machine applying the dam material on the substrate in a specified area and having a specified shape. The dam may provide a closed structure around the electronic components. The dam may comprise an inside surface pointing towards the electronic components. The dam may be shaped as a closed structure. The closed structure may be shaped as a circle, as an oval, as a rectangle etc. The inside walls of the dam structure may point towards each other. If the dam structure is shaped as a rectangle, there may be four walls. Two of the walls, such as a first wall and a third wall, may be arranged opposite each other, and two other walls, such as a second wall and a fourth wall, be arranged opposite each other. The angle between a first wall and a second wall may be about 90 degrees. The angle between a second wall and a third wall may be about 90 degrees. The angle between a third wall and a fourth wall may be about 90 degrees. The angle between a fourth wall and a first wall may be about 90 degrees. The dam may comprise an outside surface pointing towards the surroundings. The dam may comprise a bottom part pointing towards, touching and/or being in contact/connecting with the substrate. The dam may comprise a top surface being parallel to the bottom surface. The top surface may point toward the surroundings.

The method comprises providing a liquid fill encapsulation material within the dam on the substrate. The liquid fill encapsulation material may be provided before or after the dam material has cured. The liquid fill encapsulation material and the dam material may be cured together. The fill encapsulation material encapsulates the one or more electronic components. The liquid fill encapsulation material may be applied within the dam by a dedicated manufacturing machine. The liquid fill encapsulation material may have a specific viscosity providing that the liquid fill encapsulation material can flow and fill all surfaces, holes, cavities etc. on the substrate inside the boundaries of the dam. A distance between two neighbouring electronic components, e.g. a distance between the first electronic component and the second electronic component, may preferably be such that the fill encapsulation material may penetrate between the electronic components. The viscosity of the fill encapsulation material may be between 3-1000 Pa*s. The selected viscosity may depend on design and requirements.

The encapsulation material may contact or be substantially in contact with, e.g. adhering to, electronic component(s), e.g. the first electronic component and/or the second electronic component, for example such that a surface (or at least a part) of the fill encapsulation material adheres to the surface of the first electronic component and/or the second electronic component. It may be advantageous that the fill encapsulation material adheres to the first electronic component and/or the second electronic component, such that substantially no air is trapped between the fill encapsulation material and the surface of the first electronic component and/or the second electronic component. This may further avoid that any moisture penetrates and collects between the fill encapsulation material and the electronic component(s), such as the first electronic component and/or the second electronic component, which may lead to damage or misfunction of the electronic component(s).

The fill encapsulation material may be an epoxy based material. The fill encapsulation material may for example be a material such as Namics U8443, Chipcoat U8443, UV-coat 6843, G8345, or the like, e.g. similar names but with a different suffix. The fill encapsulation material is configured to solidify. The liquid fill encapsulation material is configured to solidify or become solid after being provided or applied on the substrate. Solid or solidified in this respect may mean that at least a part of the fill encapsulation material is solid. When the fill encapsulation material is solid, another material may be applied on at least a part of the fill encapsulation material. The solidified or solid fill encapsulating material comprises a first surface exposed to surroundings. When the fill encapsulation material is solid, there is a first surface of the fill encapsulation material where a cover material can be applied. If the first surface is not solidified, the cover material may diffuse into the fill encapsulation material. Solidified may not mean cured. Curing may be performed in another step. Curing may comprise UV curing or heat curing. The fill encapsulation material may change from first being a liquid material, then a solid material, and then a cured material.

The first surface of the fill encapsulation material is exposed to the surroundings. The first surface of the fill encapsulation material may be exposed to air. The first surface of the fill encapsulation material may point towards the surroundings. The first surface of the fill encapsulation material may be parallel with the substrate. The first surface of the fill encapsulation material may be an uppermost surface of the fill encapsulation material. The other surfaces of the solid fill encapsulation material will point towards the substrate and towards the inside walls of the dam.

The method comprises applying a cover material on the first surface of the solidified fill encapsulation material. The method may comprise that the cover material is applied on the solidified fill encapsulation material. The cover material may be applied by spraying or jetting, such as with spray, aerosol or jetting. The cover material comprises an electrically conducting material. The electrically conducting material may be silver. The cover material may comprise a material being a combination or mix of an epoxy based material and the electrically conducting material, such as silver. The cover material may comprise or may be a material, such as Genes'ink® Smart spray S-CS11101, Genes'ink® Smart'ink S-CS21303, Genes'ink® Smart'ink S-CS01520, Tatsuta® AE1244, Tatsuta® AE5000A5, Tatsuta® AE5000L, Tatsuta® AE5000ST, or Tatsuta® SF-PC5600 or the like.

As both the cover material and the dam material comprises electrically conducting material, such as silver or copper, the dam and the cover provide an electromagnetic shield of the encapsulated electronic components due to the conductivity of e.g. the metal.

The cover material and the dam material may be in contact and/or connect or adhere to each. As the dam material may be connected to ground if arranged on the ground ring of the substrate, the cover material may have ground connection through the dam material.

The dam material, the fill encapsulation material and the cover material may all be epoxy based materials, whereby these materials will adhere well to each other. Thus, the one or more electronic components are encapsulated and electromagnetically shielded.

It is a problem in prior art that when using jetting technology to encapsulate components, it is difficult to control that the encapsulation material stays in intended place on the substrate. This might result in encapsulation material covering keep out areas on the substrate. In the electronic industry, a dam epoxy material is commonly used to keep encapsulation material within keepout zones on a substrate. The dam is then filled up with epoxy material.

It is problem in prior art that when jetting/printing on the sides of a dam, using jetting technology, this will introduce bad uniformity of the material depending on the height of the dam. It is a problem in prior art that applying EMI materials on jettet encapsulation may result in poor shielding effectiveness for the EMI shield if the sides of the dam are not covered, such as sufficiently covered, by the EMI material.

In prior art, jetting techniques, like a tilted nozzle, to improve sides coverage of the dam will complicate the production process.

It is thus an advantage of the present method that the prior art dam material is replaced with a dam material comprising an electrically conducting material such as a silver epoxy material.

This provides that the dam is now conductive and can be placed, for example, on top of the ground ring of the substrate, e.g. PCB, and can be used to keep encapsulation material out of keep out zones on the substrate.

The present method comprises providing fill encapsulation material within the boundaries of the dam. After this encapsulation material has been added then a cover material, for example a silver-epoxy EMI material, can be applied, such as by either spray or jetting. The cover EMI material connects to the conductive dam quite naturally.

The conductive dam can be fully solid or have a conductive outer layer to save silver material.

The design of the substrate, such as a printed circuit board (PCB), may have a ground ring around the components or area that needs EM shielding. The electronic components, such as surface mounted devices (SMD), may first be assembled on the substrate before providing the dam. Then the following process may be performed. First apply the conductive dam on the substrate, such as on top of ground ring. The height of the dam can vary from for example 1 μm to 5 mm, such as ideally 0.1-1 mm. Then the dam material may be cured if needed. Then the fill encapsulation material is applied inside the dam. Then the fill encapsulation material, and possibly also the dam material, may be cured. Curing may be performed using UV light which does not require heat or time. Curing may be performed by other means. Then a cover material, which may be an electromagnetic interference (EMI) material, is applied, such as with either spray or jetting, suing e.g. spray, aerosol or jetting. Finally, a final curing of all the material may be performed.

In some embodiments, the cover material is provided on the first surface of the solidified fill encapsulation material. In some embodiments, the cover material is provided only on the first surface of the solidified fill encapsulation material.

In some embodiments, the cover material is not provided on an outside wall of the dam material. In some embodiments, the cover material is applied/provided to cover an outside wall of the dam material.

It is an advantage that cover material do not have to be provided on vertical sides of the dam. It is an advantage not to provide cover material on vertical sides of the dam, as it is difficult to control the cover material on vertical sides when jetting. As the dam itself is conductive, the cover material need not be applied on the outside walls of the dam.

It is an advantage that the cover material may have ground connection through the dam material, when the dam material and the cover material are adhered or in contact with each other, and if the dam material has ground connection, e.g.

when the dam is provided on or in connection with the ground plane of the substrate.

In some embodiments, the cover material is applied by spraying or jetting. The application of cover material by spraying or jetting may be by spray, aerosol or jetting.

Jetting or non-contact dispensing is an additive process where a material is deposited by rapidly shooting it at a substrate without making any physical contact. Like dispensing, it is a drop on demand process which produces consistent results and minimum material wastage. It is a versatile process which allows a material to be deposited in any shape or pattern. Jetting for electronic packaging and precision manufacturing allows device designers to make advanced package designs for smaller products. Jetting technology is based on valves controlled by actuators such as piezoelectric actuators. These actuators control opening and closing of the valve. A jetting deposition involves the jetting valve hovering over a defined area of substrate and then opening for a predefined time period which causes a specific quantity of material to be jetted out through a nozzle. The rapid ejection of the materials is caused by pneumatic pressure applied to the material to be jetted. A series of droplets or a steady stream of a material can be jetted to fill an area on a substrate. A jetting system consists of a jetting head, jetting controller, a syringe, XYZ axis movement stage and a pneumatic pressure valve. The material to be jetted is placed in a syringe which is connected to the jetting head. The pneumatic pressure valve is connected to the other end of syringe through an air hose to control the pressure applied to the contents of the syringe. The jetting controller controls the opening and closing of the valve and the period of time the valve is opened. The XYZ movement stage digitally defines an area of the substrate where the material is required to be deposited. A computer is an optional component of a jetting system, it can co-ordinate the movement of the XYZ stage, opening and closing of the jetting valve. In some cases the jetting controller receives the signal to open and close the valve directly from the movement stage; in such cases a computer is not essential.

In some embodiments, the method comprises applying an environmental protection on the cover material and an outside wall of the dam. The environmental protection may be a protective cover or a protective material. The environmental protection may be an epoxy based material, such that it adheres to the cover material and the dam. The environmental protection is configured to protect the encapsulated electronic components, the dam and the cover material against the environment, when arranged in an electronic device, such as hearing device. The environment may include temperature changes, radiation, moist etc. The environmental protection may be a material such as Namic Chipcoat U8443 or HumiSeal UV40HV. The material can be used to protect the outside of the metal adhesive from contamination.

In some embodiments, the cover material, and/or the fill encapsulation material and/or the dam material are configured to connect to each other. Thus, the cover material may adhere to the first surface of the fill encapsulation material. An electrical connection may establish, occur or form between the dam material and the cover material. The materials may connect to each other due to the material properties, such as if using epoxy based materials, then the materials will adhere to each other due to the properties of epoxy. The materials may have thermal properties and/or thermoplastic properties which provide that the connect. When the materials connect to each other, it is an advantage that a closed surface working as an EMI shield is provided.

Epoxy refers to any of the basic components or cured end products of epoxy resins, as well as a colloquial name for the epoxide functional group. Epoxy resins, also known as polyepoxides, are a class of reactive prepolymers and polymers which contain epoxide groups. Epoxy resins may be reacted (cross-linked) either with themselves through catalytic homopolymerisation, or with a wide range of co-reactants including polyfunctional amines, acids, acid anhydrides, phenols, alcohols and thiols, usually called mercaptans. These co-reactants are often referred to as hardeners or curatives, and the cross-linking reaction is commonly referred to as curing. Reaction of polyepoxides with themselves or with polyfunctional hardeners forms a thermosetting polymer, often with favorable mechanical properties and high thermal and chemical resistance.

In some embodiments, the fill encapsulation material comprises an epoxy based material, an acrylic based material and/or a polymer based material. This material may be a non-conductive material.

In some embodiments, the cover material comprises an epoxy based material, an acrylic based material and/or a polymer based material. This material may be a non-conductive material. The cover material also comprises an electrically conductive material. The non-conductive material and the conductive material of the cover may be mixed or may be arranged in separate layers.

In some embodiments, the dam material comprises an epoxy based material, an acrylic based material and/or a polymer based material. This material may be a non-conductive material. The dam material also comprises an electrically conductive material. The non-conductive material and the conductive material of the dam may be mixed or may be arranged in separate layers.

In some embodiments, the dam material comprises a first material, which is a mixture of an epoxy based material and the electrically conducting material. Thus, the dam may comprise only the first material. Thus, the dam may comprise for example silver in the entire dam material. The solvent of the dam material, e.g. an epoxy based material, may be between 10 and 50% depending on material type. The density of the material after curing may be between 3 to 5 g/cm3. The weight of the electrically conducting material, e.g. pure silver, may be 10.50 g/cm3. The ratio of the electrically conducting material relative to the solvent material may be in the range from 10-60%

In some embodiments, the dam material comprises two materials, wherein a primary material of the two materials comprises an epoxy based material, and wherein a secondary material of the two materials comprises an electrically conducting material. Thus, the dam may comprise these two materials separate from each other. The secondary material is different from the primary material. The primary material, which is the epoxy based material, may comprise no electrically conducting material. The primary material comprising the epoxy based material may be in the centre of the dam. The secondary material comprising the electrically conducting material may be on the outside surface of the dam surrounding the centre of the dam. It is an advantage to use two separate materials for the dam, as the electrically conducting material, such as silver, may be expensive to use, and if only the outside surface of the dam is with this material, and the centre of the dam is an inexpensive material, then the cost may be reduced.

In some embodiments, the two materials of the dam are applied to the substrate in one step by using a nozzle having at least two outlets. The dam material may be applied to the substrate through a nozzle. The nozzle may have more outlets, as an epoxy based material may be a two-component material, which may first be mixed when applied to the substrate, thus a nozzle applying an epoxy based material may have two outlets for the epoxy based material itself. Thus, the electrically conducting material, such as the silver material may be applied through a third outlet of nozzle. The electrically conducting material may also comprise an epoxy based material, thus even more outlets of the nozzle may be used.

In some embodiments, the dam material defines a dam surrounding an area of the substrate. The area may comprise the electronic components to be encapsulated.

In some embodiments, the substrate comprises a conductive track interconnected with a ground plane of the substrate. In some embodiments the dam material is provided on at least a part of the conductive track. The conductive track may be interconnected with the ground plane through a "via" or via a "through hole" in the substrate. The dam material may be provided on top of the ground ring. The conducting material of the dam may be placed on top of a trace connected to the ground connection of the substrate. It is an advantage that hereby electrical grounding is obtained.

In some embodiments, the dam material is cured before the fill encapsulation material is provided. In some embodiments, the dam material and the fill encapsulation material are cured together. In some embodiments, the cover material, the fill encapsulation material and dam material are cured together. In some embodiments, the environmental protection, the cover material, the fill encapsulation material and dam material are cured together. The curing may be thermal curing, and/or UV curing, and/or curing over time. The dam material may have a high filler loading. The fill material may have low filler loading.

It is an advantage of UV-curing that it allows rapid setting of the materials in just a few seconds by applying UV light onto the material. This makes the material suitable for encapsulating components in fully automated high-volume production.

It is an advantage to use thermal curing at it allows for curing also in dark areas that the UV light cannot reach. Thus, if the material, such as the fill encapsulation material, is in black colour, the material can be cured using thermal curing.

In some embodiments, the one or more electronic components are surface mounted components (SMC), surface mounted devices (SMD) or discrete components. In some embodiments, the one or more electronic components are integrated circuit chips. In some embodiments, the one or more electronic components comprises a system-in-a-package. In some embodiments, the one or more electronic components is a plurality of electronic components. In some embodiments, at least one of the one or more electronic components is a surface mounted component or a discrete component. In some embodiments, at least one of the one or more electronic components is an integrated circuit chip. In some embodiments, at least one of the one or more electronic components is a system-in-a package. The surface mounted components or discrete components may be transistors, resistors, transducers, capacitors, integrated circuits, inductors, diodes, signal processing units, batteries etc. The integrated circuit chips may be silicon chips. The system-in-a-package may be a hybrid.

The one or more electronic components may comprise a power supply unit such as switch-mode power supply e.g. comprising a switch capacitor or an inductor, e.g. as the first electronic component. The one or more electronic components may comprise a receiver such as a speaker, a microphone, a filter, an antenna e.g. a magnetic radio, and/or an interface.

The one or more electronic components may generate electromagnetic fields of different magnitudes and at different frequencies, thereby creating electromagnetic interference between the electronic components, the electromagnetic interference being more or less disturbing for other electronic components e.g. depending on the operating frequencies of the electronic components and the magnitude of the electromagnetic fields.

The one or more electronic components may comprise a first electronic component and optionally a second electronic component on the substrate. The one or more electronic components, such as the first electronic component and/or the second electronic component may be mounted to e.g. by being soldered, embedded in the substrate, or bonded e.g. wire bonded or adhesive bonded to the substrate. The method may comprise mounting a plurality of electronic components on the substrate.

Surface mounted devices or components may be assembled using a surface-mount technology (SMT) which is a method for producing electronic circuits in which the components are mounted or placed directly onto the surface of printed circuit boards (PCBs). An electronic device so made is called a surface-mount device (SMD). In industry, it has largely replaced the through-hole technology construction method of fitting components with wire leads into holes in the circuit board. Both technologies can be used on the same board, with the through-hole technology used for components not suitable for surface mounting such as large transformers and heat-sinked power semiconductors. By employing SMT, the production process speeds up. An SMT component is usually smaller than its through-hole counterpart because it has either smaller leads or no leads at all. It may have short pins or leads of various styles, flat contacts, a matrix of solder balls (BGAs), or terminations on the body of the component.

In some embodiments, the substrate is a printed circuit board (PCB), or a carrier printed circuit board (PCB), or a panel configured to be mounted on a printed circuit board. In some embodiments, a system-in-a-package is produced on a PCB panel and then singulated for "pick and place" SMD (surface mounted device) process. The substrate may be configured to mechanically support and electrically connect one or more electronic components using e.g. conductive tracks or pads. The substrate may comprise one or more sheet layers of a conductive layer, laminate, or film such as of copper e.g. laminated onto and/or between sheet layers of a non-conductive substrate.

In some embodiments, encapsulation of the one or more electronic components comprises encapsulation of at least some of the electronic component surfaces which are exposed to the surroundings. The surface of the electronic components (EC) may point "downwards" towards the substrate, point to the "sides" towards the inside walls of the dam or point "upwards" towards the cover material. In particular, the surfaces of the EC pointing towards the sides of the dam and upwards towards surrounding may be encapsulated. However, the electronic components (EC) may not "stand" or "touch" on the substrate with their entire bottom surface, the EC may "float" a few micrometers or millimeters above the substrate with the majority of the their bottom surface and just be connected to be substrate at a few smaller connection points.

According to an aspect, disclosed is a system comprising one or more electronic components on a substrate. The one or more electronic components are encapsulated on the substrate. The encapsulation of the one or more electronic components comprises a dam on the substrate. The dam is provided around the one or more electronic components. The dam comprises a dam material comprising an electrically conducting material. The encapsulation of the one or more electronic components comprises a fill encapsulation material within the dam on the substrate. The fill encapsulation material encapsulates the one or more electronic components. The fill encapsulating material comprises a first surface. The encapsulation of the one or more electronic components comprises a cover material on the first surface of the fill encapsulation material. The cover material comprising an electrically conducting material. Whereby the one or more electronic components are encapsulated and electromagnetically shielded.

In some embodiments, the one or more electronic components are encapsulated according to the method disclosed above.

According to an aspect, disclosed is hearing device comprising one or more electronic components on a substrate. The one or more electronic components are encapsulated on the substrate. The encapsulation of the one or more electronic components comprises a dam on the substrate. The dam is provided around the one or more electronic components. The dam comprises a dam material comprising an electrically conducting material. The encapsulation of the one or more electronic components comprises a fill encapsulation material within the dam on the substrate. The fill encapsulation material encapsulates the one or more electronic components. The fill encapsulating material comprises a first surface. The encapsulation of the one or more electronic components comprises a cover material on the first surface of the fill encapsulation material. The cover material comprising an electrically conducting material. Whereby the one or more electronic components are encapsulated and electromagnetically shielded.

In some embodiments, the one or more electronic components are encapsulated according to the method disclosed above.

The present disclosure relates to different aspects including the method described above and in the following, and corresponding methods, hearing devices, systems, system parts, devices, networks, kits, uses and/or product means, each yielding one or more of the benefits and advantages described in connection with the first mentioned aspect, and each having one or more embodiments corresponding to the embodiments described in connection with the first mentioned aspect and/or disclosed in the appended claims.

BRIEF DESCRIPTION OF THE DRAWINGS

The above and other features and advantages will become readily apparent to those skilled in the art by the following detailed description of exemplary embodiments thereof with reference to the attached drawings, in which:

FIG. 4 schematically illustrates an example of a hearing device 20.

DETAILED DESCRIPTION

Figure 1A:
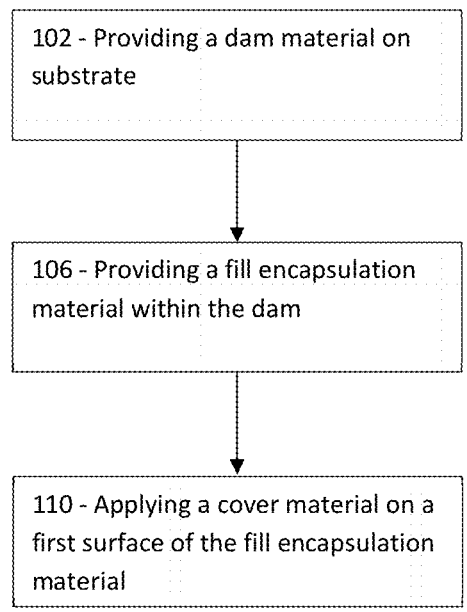
FIGS. 1a) and 1b) schematically illustrates an example of method 100 for encapsulating one or more electronic components on a substrate.

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Throughout, the same reference numerals are used for identical or corresponding parts.

FIGS. 1a) and 1b) schematically illustrates an example of method 100 for encapsulating one or more electronic components on a substrate.

In FIG. 1a), the method 100 comprises providing 102 a dam on the substrate. The dam is provided around the one or more electronic components. The dam comprises a dam material comprising an electrically conducting material. The method 100 comprises providing 106 a liquid fill encapsulation material within the dam on the substrate. The fill encapsulation material encapsulates the one or more electronic components. The fill encapsulation material is configured to solidify. The solidified fill encapsulating material comprises a first surface exposed to surroundings. The method 100 comprises applying 110 a cover material on the first surface of the solidified fill encapsulation material. The cover material comprises an electrically conducting material. Thereby the one or more electronic components are encapsulated and electromagnetically shielded.

Figure 1B:
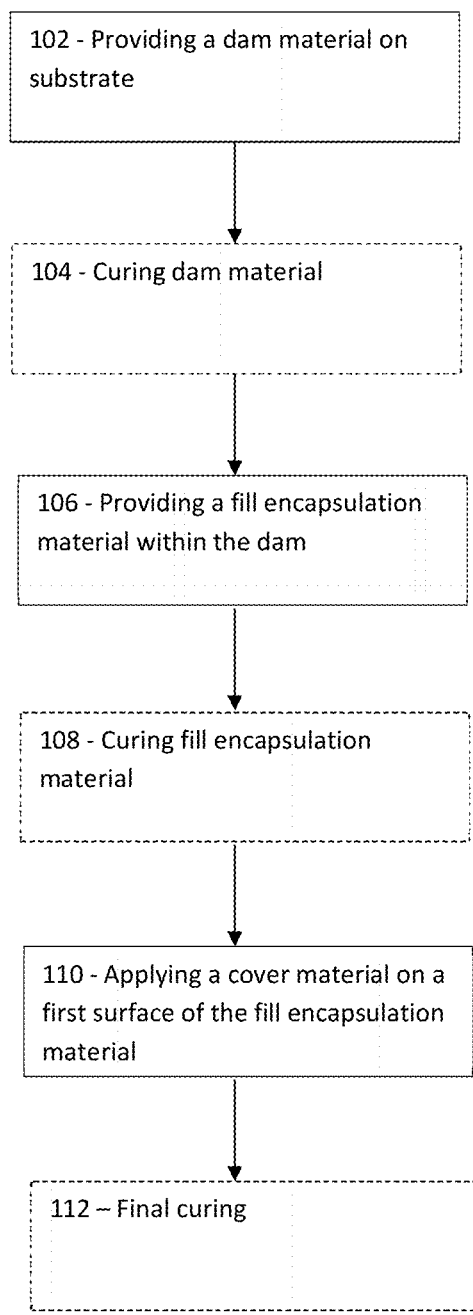

In FIG. 1b), the method 100 comprises providing 102 a dam on the substrate. The dam is provided around the one or more electronic components. The dam comprises a dam material comprising an electrically conducting material. The method 100 comprises curing 104 the dam material. The method 100 comprises providing 106 a liquid fill encapsulation material within the dam on the substrate. The fill encapsulation material encapsulates the one or more electronic components. The fill encapsulation material is configured to solidify. The solidified fill encapsulating material comprises a first surface exposed to surroundings. The method 100 comprises curing 108 the fill encapsulation material. The method 100 comprises applying 110 a cover material on the first surface of the solidified fill encapsulation material. The cover material comprises an electrically conducting material. The method 100 comprises performing a final curing 112 of the materials. Thereby the one or more electronic components are encapsulated and electromagnetically shielded. The method 100 may further comprise applying an environmental protection on the cover material and the outside walls of the dam.

FIG. 2 schematically illustrates an example of a substrate 4 with encapsulated electronic components 2 and a method or process for encapsulating the one or more electronic components 2 on the substrate 4. The substrate 4 is seen from above, in a top view, in FIG. 2.

Figure 2A:
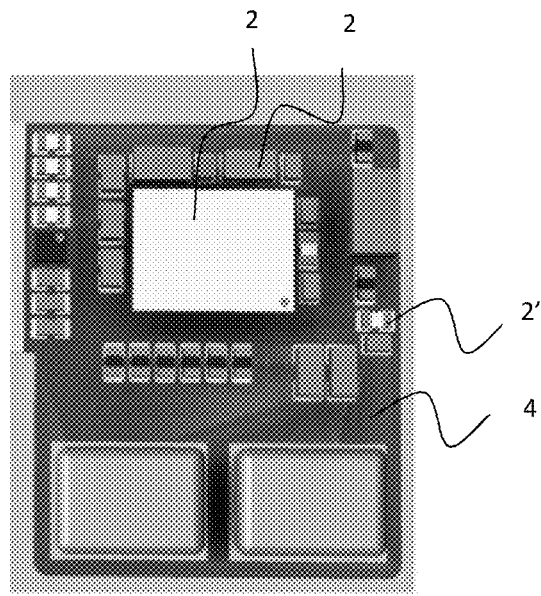
FIGS. 2a), 2b), 2c) and 2d) schematically illustrate an example of a substrate 4 with encapsulated electronic components 2 and a method or process for encapsulating the one or more electronic components 2 on the substrate 4.

In FIG. 2a), a substrate 4 is shown. The substrate 4 comprises one or more electronic components 2. The substrate 4 may be a printed circuit board. The electronic components 2 may be assembled on the substrate 4 as surface mounted components. The electronic components may be transistors, capacitors, signal processing units etc. The electronic components may be different components or the same components. The electronic components may have different sizes and shapes, such as different height, different volumes etc.

Figure 2B:
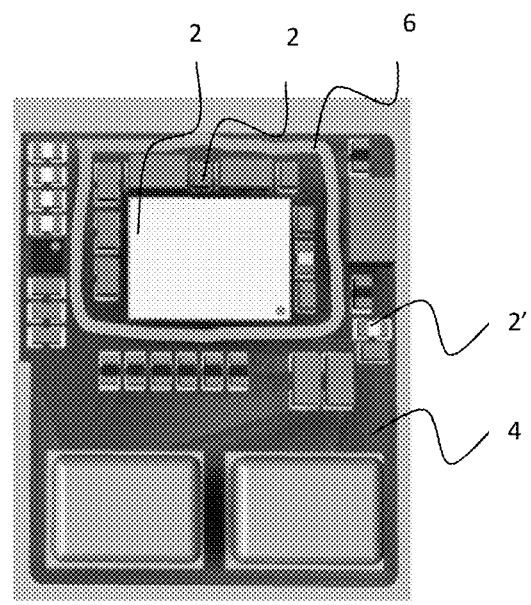

In FIG. 2b), a dam 6 is provided around the one or more electronic components 2. The dam 2 comprises a dam material comprising an electrically conducting material. The dam 6 is provided around some of the electronic components 2 on the substrate 4, and some of the electronic components 2' are not surrounded by the dam 6. The dam 2 may be arranged at least partly on or in connection with a ground ring of the substrate 4.

Figure 2C:
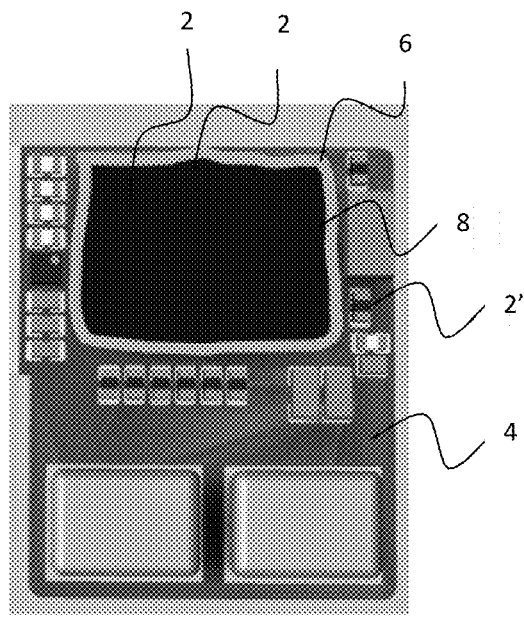

In FIG. 2c), a liquid fill encapsulation material 8 is provided within the dam 6 on the substrate 4. The fill encapsulation material 8 encapsulates the one or more electronic components 2. The fill encapsulation material 8 is configured to solidify. The solidified fill encapsulating material 8 comprises a first surface exposed to surroundings. The fill encapsulation material 8 may be dark, such as black, as shown in this figure, or it may have another color.

Figure 2D:
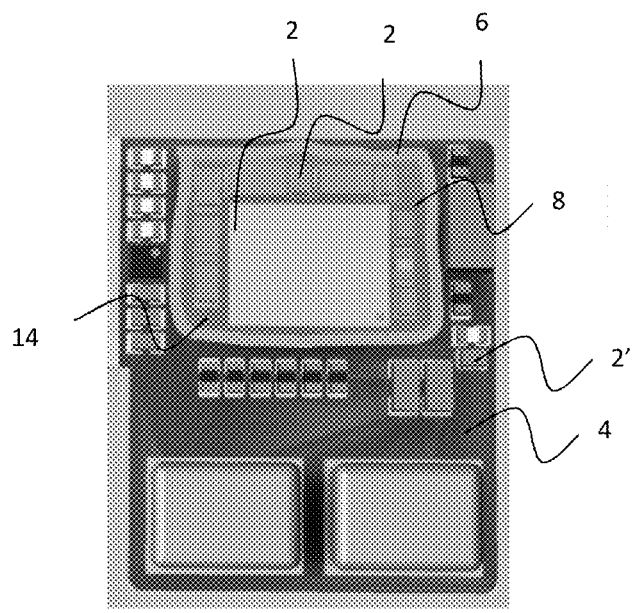

In FIG. 2d), a cover material 14 is applied on the first surface of the solidified fill encapsulation material 8. The cover material 14 comprises an electrically conducting material. Due to the electrically conducting dam material and cover material, the one or more electronic components 2 are encapsulated and electromagnetically shielded.

FIG. 3 schematically illustrates an example of a substrate 4 with encapsulated electronic components 2 and a method or process for encapsulating the one or more electronic components 2 on the substrate 4. The substrate 4 is seen from the side in a cross-section, in a side cross-section view, in FIG. 3.

Figure 3A:
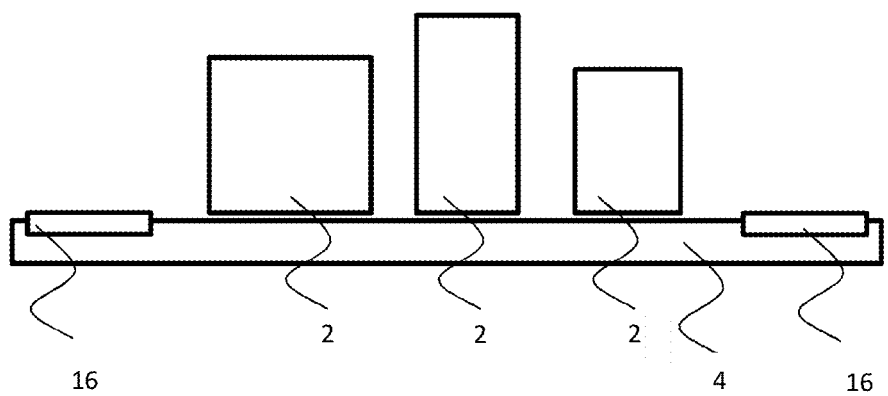
FIGS. 3a), 3b), 3c), 3d) and 3e) schematically illustrate an example of a substrate 4 with encapsulated electronic components 2 and a method or process for encapsulating the one or more electronic components 2 on the substrate 4.

In FIG. 3a), a substrate 4 is shown. The substrate 4 comprises one or more electronic components 2. The substrate 4 may be a printed circuit board. The electronic components 2 may be assembled on the substrate 4 as surface mounted components. The electronic components may be transistors, capacitors, signal processing units etc. The electronic components may be different components or the same components. The electronic components may have different sizes and shapes, such as different height, different volumes etc.

A ground ring 16 or a connection to a ground plane 16 is provided in the substrate 4.

Figure 3B:
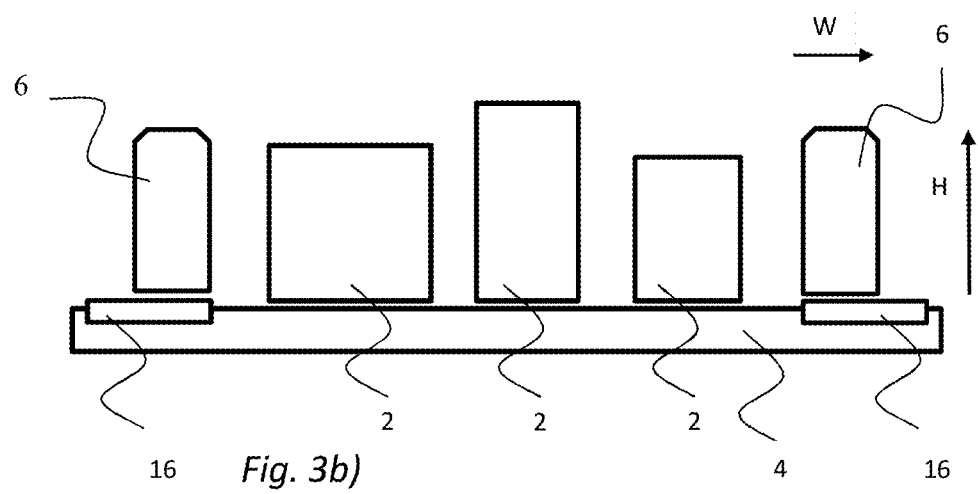

In FIG. 3b), a dam 6 is provided around the one or more electronic components 2. The dam 2 comprises a dam material comprising an electrically conducting material. The dam 6 is provided around some of the electronic components 2 on the substrate 4, and some of the electronic components 2' are not surrounded by the dam 6. The dam 6 may be provided on the ground ring 16 or interconnected with a ground plane 16. The height H of the dam 6 may be smaller than the height of the highest of the electronic components. The height H of the dam 6 may be equal to the height of the highest of the electronic components. The height H of the dam 6 may be higher than the height of the highest of the electronic components. The width W of the dam 6 may be smaller than the height of the dam 6. The width W of the dam 6 may be equal to the height of the dam 6. The width W of the dam 6 may be larger than the height of the dam 6.

Figure 3C:
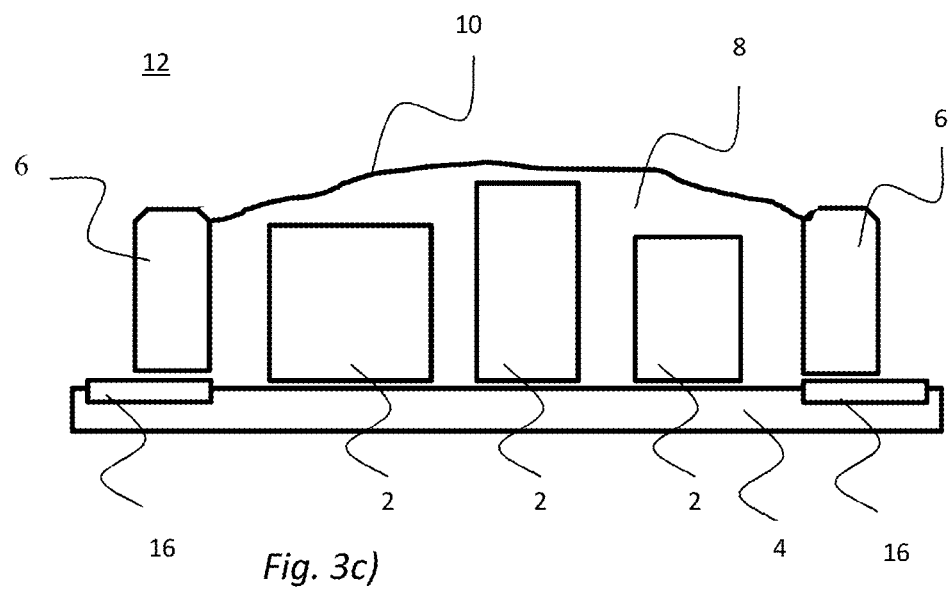

In FIG. 3c), a liquid fill encapsulation material 8 is provided within the dam 6 on the substrate 4. The fill encapsulation material 8 encapsulates the one or more electronic components 2. The fill encapsulation material 8 is configured to solidify. The solidified fill encapsulating material 8 comprises a first surface 10 exposed to surroundings 12. The first surface 10 may point upwards in a manufacturing process. The first surface 10 may be parallel to the substrate 4. A vector normal to the first surface 10 may be parallel to the substrate 4. The first surface 10 may be flat and homogenous.

Figure 3D:
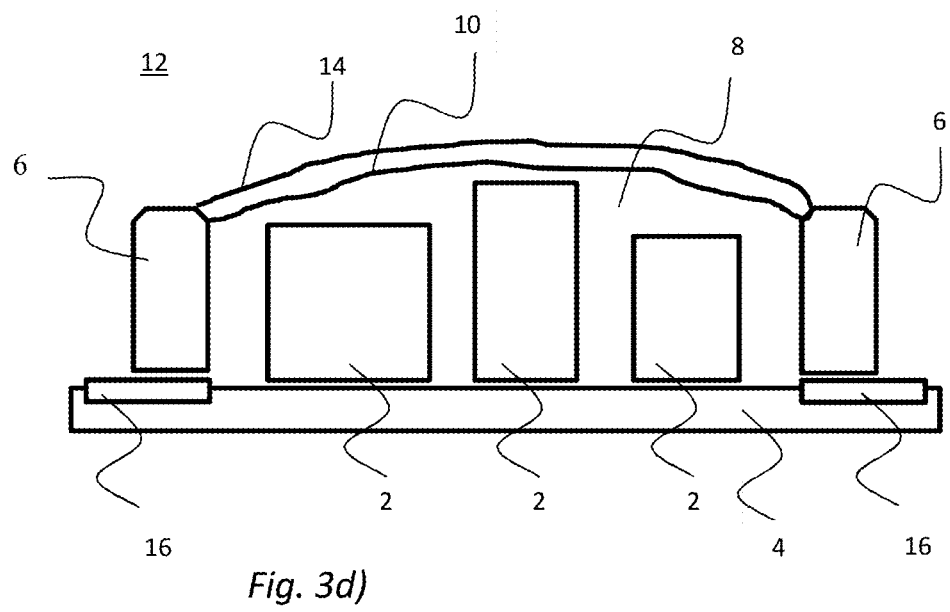

In FIG. 3d), a cover material 14 is applied on the first surface 10 of the solidified fill encapsulation material 8. The cover material 14 comprises an electrically conducting material. Due to the electrically conducting dam material 6 and cover material 14, the one or more electronic components 2 are encapsulated and electromagnetically shielded.

In FIG. 3e), an environmental protection 18 is applied on the cover material 14 and the outside walls of the dam 6.

FIG. 4 schematically illustrates an example of a hearing device 20, such as a hearing aid. The hearing device 20 comprises a microphone 22, for receiving an input signal and converting it into an audio signal. The audio signal is provided to a processing unit 24 for processing the audio signal and providing a processed output signal for compensating a hearing loss of a user of the hearing device 20. A receiver 26 is connected to an output of the processing unit 24 for converting the processed output signal into an output sound signal, e.g. a signal modified to compensate for a user's hearing impairment. Typically, the receiver 26 comprises a transducer, and the receiver 26 is often referred to as a speaker. The processing unit 24 may comprise elements such as amplifiers, compressors, noise reduction systems, etc. The hearing device 20 may further comprise a wireless communication unit 28 for wireless data communication interconnected with an antenna structure 30 for emission and reception of an electromagnetic field. The wireless communication unit 28, such as a radio or a transceiver, connects to the processing unit 24 and the antenna structure 30, for communicating with an electronic device, an external device, or with another hearing device, such as another hearing aid located in/on/at another ear of the user, typically in a binaural hearing system. The hearing device 20 may comprise two or more antenna structures.

The hearing device 20 may be a behind-the-ear hearing device, and may be provided as a behind-the-ear module. The hearing device 20 may be an in-the-ear hearing device and may be provided as an in-the-ear module. Alternatively, parts of the hearing device 20 may be provided in a behind-the-ear module, while other parts, such as the receiver 26, may be provided in an in-the-ear module.

Figure 5A:
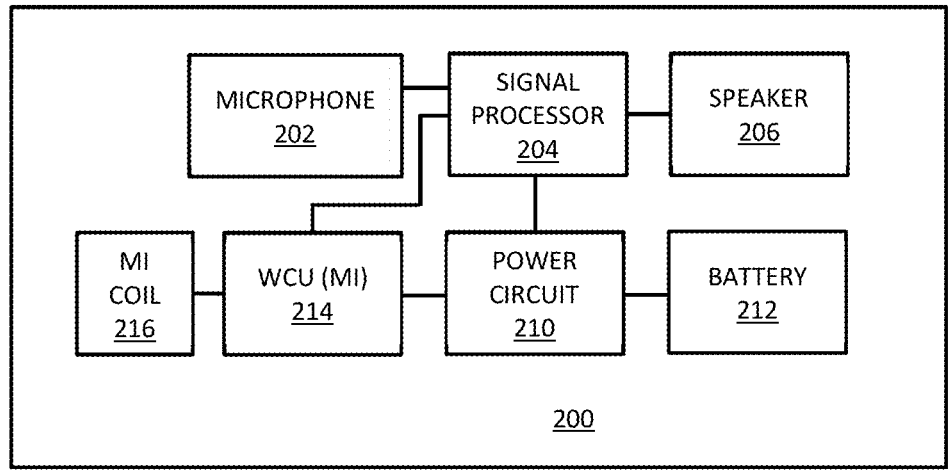
FIGS. 5a) and 5b) schematically illustrate an example of a block-diagram of an embodiment of a hearing device 200.

FIGS. 5a) and 5b) schematically illustrate an example of a block-diagram of an embodiment of a hearing device 200. In FIG. 5a), the hearing device 200 comprises a first transducer, i.e. microphone 202, to generate one or more microphone output signals based on a received an audio signal. The one or more microphone output signals are provided to a signal processor 204 for processing the one or more microphone output signals. A receiver or speaker 206 is connected to an output of the signal processor 204 for converting the output of the signal processor into a signal modified to compensate for a user's hearing impairment, and provides the modified signal to the speaker 206.

The hearing device signal processor 204 may comprise elements such as an amplifier, a compressor and/or a noise reduction system etc. The signal processor 204 may be implemented in a signal processing chip 204'. The hearing device may further have a filter function, such as compensation filter for optimizing the output signal.

The hearing device further comprises a wireless communication unit 214 interconnected with magnetic induction antenna 216 such as a magnetic induction coil. The wireless communication unit 214 and the magnetic induction antenna 216 may be configured for wireless data communication using emission and reception of magnetic field. The wireless communication unit may be implemented as a wireless communication chip 214', such as a magnetic induction control chip 214'. The hearing device 200 further comprises a power source 212, such as a battery or a rechargeable battery. Furthermore, a power management unit 210 is provided for controlling the power provided from the battery 212 to the signal processor 204, the receiver, the one or more microphones, the wireless communication unit (RF) 208, and the wireless communication unit (MI) 214. The magnetic induction antenna is configured for communication with another electronic device, in some embodiments configured for communication with another hearing device, such as another hearing device located at another ear, typically in a binaural hearing device system.

The hearing device may furthermore have a wireless communication unit 208, such as a wireless communication circuit, for wireless data communication interconnected with an RF antenna 218 for emission and reception of an electromagnetic field. The wireless communication unit may be implemented as a wireless communication chip 208'. The wireless communication unit 208, including a radio or a transceiver, connect to the hearing device signal processor 204 and the RF antenna 218, for communicating with one or more external devices, such as one or more external electronic devices, including at least one smart phone, at least one tablet, at least one hearing accessory device, including at least one spouse microphone, remote control, audio testing device, etc., or, in some embodiments, with another hearing device, such as another hearing device located at another ear, typically in a binaural hearing device system.

The signal processor 204, the wireless communication unit (RF) 208, the wireless communication unit (MI) 214 and the power management unit 210 may be implemented as signal processing chip 204', wireless communication chip (RF) 208', wireless communication chip (MI) 214' and power management chip 210', respectively.

Figure 5B:
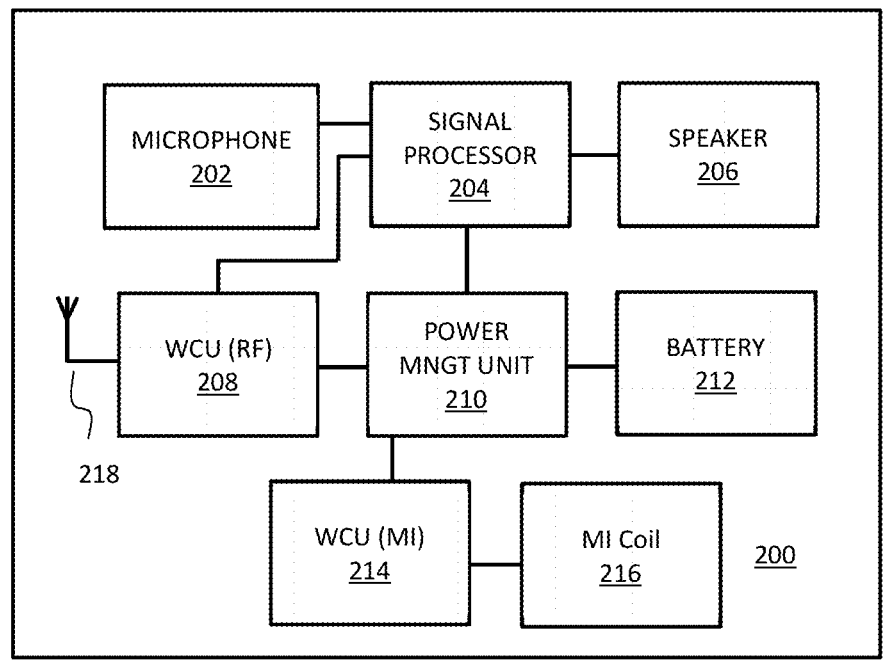

In FIG. 5b, a hearing device corresponding to the hearing device as shown in FIG. 5a is seen, except that in FIG. 5b, only one wireless communication unit 214 is present being interconnected with the magnetic induction antenna 216, the signal processor 204 and the power management unit 210.

Likewise, even though not shown, also a hearing device having only one wireless communication unit 208 being interconnected with an RF antenna for reception and emission of an electromagnetic field is envisaged.

Although particular features have been shown and described, it will be understood that they are not intended to limit the claimed invention, and it will be made obvious to those skilled in the art that various changes and modifications may be made without departing from the scope of the claimed invention. The specification and drawings are, accordingly to be regarded in an illustrative rather than restrictive sense. The claimed invention is intended to cover all alternatives, modifications and equivalents.

LIST OF REFERENCES 2 electronic components
4 substrate
6 dam
8 fill encapsulation material
10 first surface of solidified fill encapsulation material
12 surroundings
14 cover material
16 ground ring or ground plane
18 environmental protection
20 hearing device
22 microphone
24 processing unit
26 receiver
28 wireless communication unit
30 antenna structure
200 hearing device
202 first transducer, e.g. microphone
204 signal processor
204' signal processing chip
206 receiver or speaker
208 wireless communication unit (RF)
210 power management unit
212 power source
214 wireless communication unit (MI)
214' wireless communication chip
216 magnetic induction antenna
218 RF antenna
100 method
102 providing a dam on a substrate
104 curing dam
106 providing a liquid fill encapsulation material within the dam on the substrate
108 curing fill encapsulation material (and dam)
110 applying a cover material on the first surface of the solidified fill encapsulation material
112 final curing

The invention claimed is:

1. A method for covering one or more electronic components on a substrate, the method comprising:
   providing a dam on the substrate, wherein the dam is provided around the one or more electronic components, the dam comprising a dam material, wherein the dam material comprises an electrically conductive material;
   providing a liquid encapsulation material in a space contained by the dam, wherein the liquid encapsulation material is provided to encapsulate the one or more electronic components, the liquid encapsulation material configured to solidify to form a solidified encapsulating material having a first surface; and
   after the liquid encapsulation material is solidified to form the solidified encapsulating material encapsulating the one or more electronic components, applying a cover material on the first surface of the solidified encapsulation material;
   wherein the cover material forms a first layer of a cover, the cover comprising a second layer, wherein one of the first layer and the second layer is a non-conductive layer, and another one of the first layer and the second layer is a conductive layer.

2. The method of claim 1, wherein the cover material, and/or the solidified encapsulation material and/or the dam material are configured to connect to each other.

3. The method of claim 1, wherein the dam material, and/or the liquid encapsulation material, and/or the cover material comprise(s) an epoxy-based material, an acrylic based material and/or a polymer-based material.

4. The method of claim 1, wherein the dam material comprises a first material, which is a mixture of an epoxy-based material and the electrically conductive material.

5. The method of claim 1, wherein the dam material comprises at least a primary material and a secondary material, wherein the primary material comprises an epoxy-based material, and wherein the secondary material comprises the electrically conductive material.

6. The method of claim 1, wherein the substrate comprises a conductive track interconnected with a ground plane of the substrate, and wherein the dam is on at least a part of the conductive track.

7. The method of claim 1, wherein the dam material is cured before the liquid encapsulation material is provided.

8. The method of claim 1, wherein the dam material and the liquid encapsulation material are cured together.

9. The method of claim 1, wherein the one or more electronic components comprise surface mounted component(s) or discrete component(s).

10. The method of claim 1, wherein the one or more electronic components comprise integrated circuit chip(s).

11. The method of claim 1, wherein the one or more electronic components comprise a system-in-a-package.

12. The method of claim 1, wherein the substrate is a printed circuit board (PCB).

13. The method of claim 1, wherein the substrate is a carrier printed circuit board (PCB).

14. The method of claim 1, wherein the substrate is a panel configured to be mounted on a printed circuit board.

15. The method of claim 1, wherein the one or more electronic components are a subset of components on the substrate.

16. The method of claim 1, wherein at least some of the liquid encapsulation material is provided on the substrate.

17. The method of claim 1, wherein the one or more electronic components are at least partly electromagnetically shielded by the dam.

18. The method of claim 1, wherein the first surface of the solidified encapsulating material is exposed to a surrounding before the cover material is applied.

19. The method of claim 1, wherein the first layer formed by the cover material is electrically conductive.

20. The method of claim 1, wherein the cover material is configured to at least partly electromagnetically shield the one or more electronic components.

21. The method of claim 1, wherein the dam has a first side and a second side opposite from the first side, and wherein the applied cover material is closer to a top of the first side than to a bottom of the first side, and wherein the applied cover material is also closer to a top of the second side than to a bottom of the second side.

22. A system comprising:
a substrate;
one or more electronic components on the substrate;
a dam on the substrate, the dam surrounding the one or more electronic components, the dam comprising a dam material, wherein the dam material comprises an electrically conductive material;
an encapsulation material in a space contained by the dam, the encapsulation material encapsulating the one or more electronic components, the encapsulating material comprising a first surface;
a cover material disposed on the first surface of the encapsulation material that encapsulates the one or more electronic components;
wherein the cover material forms a first layer of a cover, the cover comprising a second layer, wherein one of the first layer and the second layer is a non-conductive layer, and another one of the first layer and the second layer is a conductive layer.

23. The system of claim 22, wherein the system is a hearing device.

24. The system of claim 22, wherein the dam material comprises a mixture of an epoxy-based material and the electrically conductive material.

25. The system of claim 22, wherein the substrate comprises a conductive track interconnected with a ground plane of the substrate, and wherein the dam is on at least a part of the conductive track.

26. The system of claim 22, wherein the one or more electronic components comprise surface mounted component(s) or discrete component(s).

27. The system of claim 22, wherein the one or more electronic components comprise integrated circuit chip(s).

28. The system of claim 22, wherein the one or more electronic components comprise a system-in-a-package.

29. The system of claim 22, wherein the substrate is a printed circuit board (PCB).

30. The system of claim 22, wherein the substrate is a carrier printed circuit board (PCB).

31. The system of claim 22, wherein the substrate is a panel configured to be mounted on a printed circuit board.

32. The system of claim 22, wherein the one or more electronic components are at least partly electromagnetically shielded by the dam.

33. The system of claim 22, wherein the cover material is configured to at least partly electromagnetically shield the one or more electronic components.

34. The system of claim 22, wherein the dam has a first side and a second side opposite from the first side, and wherein the cover material is closer to a top of the first side than to a bottom of the first side, and wherein the cover material is also closer to a top of the second side than to a bottom of the second side.

* * * * *